(12) United States Patent
Wu et al.

(10) Patent No.: US 11,636,902 B2
(45) Date of Patent: Apr. 25, 2023

(54) SIGNAL MODULATION APPARATUS, MEMORY STORAGE APPARATUS, AND SIGNAL MODULATION METHOD

(71) Applicant: PHISON ELECTRONICS CORP., Miaoli (TW)

(72) Inventors: Guan-Wei Wu, New Taipei (TW); Jen-Chu Wu, New Taipei (TW); Jen-Huo Wang, Tainan (TW); Yu-Chiang Liao, New Taipei (TW); Shih-Yang Sun, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 22 days.

(21) Appl. No.: 17/468,711

(22) Filed: Sep. 8, 2021

(65) Prior Publication Data

US 2023/0048903 A1 Feb. 16, 2023

(30) Foreign Application Priority Data

Aug. 10, 2021 (TW) .................................. 110129366

(51) Int. Cl.
*G11C 16/32* (2006.01)
*G11C 7/10* (2006.01)
*G11C 7/22* (2006.01)
*G11C 29/10* (2006.01)
*H01L 27/20* (2006.01)
(Continued)

(52) U.S. Cl.
CPC ............ *G11C 16/32* (2013.01); *G11C 7/1063* (2013.01); *G11C 7/222* (2013.01); *G11C 29/12015* (2013.01); *H04L 27/20* (2013.01)

(58) Field of Classification Search
CPC ....... G11C 16/32; G11C 7/1063; G11C 7/222; G11C 29/12015; H04L 27/20
See application file for complete search history.

(56) References Cited

U.S. PATENT DOCUMENTS

| 8,502,577 | B2 * | 8/2013 | Ok ........................ H03L 7/0816 327/158 |
| 8,782,458 | B2 * | 7/2014 | Nygren ............... G06F 13/4243 713/500 |
| 9,106,230 | B1 * | 8/2015 | Wang ................. H03K 19/1737 |

(Continued)

OTHER PUBLICATIONS

Office Action of Taiwan Counterpart Application, dated Jul. 4, 2022, pp. 1-15.

*Primary Examiner* — Tri M Hoang
(74) *Attorney, Agent, or Firm* — JCIPRNET

(57) ABSTRACT

A signal modulation apparatus, a memory storage apparatus, and a signal modulation method are disclosed. The signal modulation apparatus includes an observation circuit, a signal modulation circuit, and a phase control circuit. The signal modulation circuit is configured to generate a second signal according to a first signal and a reference clock signal. A frequency of the first signal is different from a frequency of the second signal. The phase control circuit is configured to obtain an observation information via the observation circuit. The observation information reflects a process variation of at least one electronic component in the signal modulation apparatus. The phase control circuit is further configured to control an offset between the first signal and the reference clock signal according to the observation information.

42 Claims, 6 Drawing Sheets

(51) Int. Cl.
*G11C 29/12* (2006.01)
*H04L 27/20* (2006.01)

(56) References Cited

U.S. PATENT DOCUMENTS

| | | | |
|---|---|---|---|
| 9,240,804 B2 * | 1/2016 | Wortman | H04L 25/14 |
| 9,906,231 B2 * | 2/2018 | Kang | H03L 7/091 |
| 10,706,910 B2 * | 7/2020 | Ware | G06F 13/4086 |
| 10,944,406 B1 * | 3/2021 | Du | H04L 7/033 |
| 10,972,107 B2 * | 4/2021 | Han | H04L 25/03885 |
| 11,092,994 B1 * | 8/2021 | Hong | G06F 1/06 |
| 11,233,589 B2 * | 1/2022 | Ho | H04L 25/03949 |
| 2007/0263757 A1 | 11/2007 | Dally et al. | |
| 2018/0278406 A1 | 9/2018 | Palusa et al. | |

\* cited by examiner

SIGNAL MODULATION APPARATUS, MEMORY STORAGE APPARATUS, AND SIGNAL MODULATION METHOD

CROSS-REFERENCE TO RELATED APPLICATION

This application claims the priority benefit of Taiwan application serial no. 110129366, filed on Aug. 10, 2021. The entirety of the above-mentioned patent application is hereby incorporated by reference herein and made a part of this specification.

BACKGROUND OF THE INVENTION

Field of the Invention

The invention relates to a signal modulation technique, and particularly relates to a signal modulation apparatus, a memory storage apparatus, and a signal modulation method.

Description of Related Art

In a high-speed signal transmission technique, a signal often needs to be modulated before being transmitted to meet the transmission rate requirements of a high-speed signal. For example, in a high-speed signal modulation circuit, a signal to be transmitted may be sampled at twice the frequency or above to increase signal transmission rate. However, as signal transmission rate becomes higher, the time margin of the signal becomes smaller, making the calibration between a reference clock signal and a data signal more difficult.

Most signal modulation circuits perform a phase lock between the reference clock signal and the data signal via the delay control of a delay element and/or a phase-locked loop (PLL) circuit. However, in practice, no matter whether the phase lock is performed via a delay element or a PLL circuit, they are both readily affected by the process variation of a portion of electronic components, thus causing an increase in the jitter of the output signal.

SUMMARY OF THE INVENTION

The invention provides a signal modulation apparatus, a memory storage apparatus, and a signal modulation method that may improve the stability of (high-speed) signal output.

An exemplary embodiment of the invention provides a signal modulation apparatus including an observation circuit, a signal modulation circuit, and a phase control circuit. The signal modulation circuit is configured to generate a second signal according to a first signal and a reference clock signal. A frequency of the first signal is different from a frequency of the second signal. The phase control circuit is coupled to the signal modulation circuit and the observation circuit. The phase control circuit is configured to obtain an observation information via the observation circuit. The observation information reflects a process variation of at least one electronic component in the signal modulation apparatus. The phase control circuit is further configured to control an offset between the first signal and the reference clock signal according to the observation information.

An exemplary embodiment of the invention further provides a memory storage apparatus including a connection interface unit, a rewritable non-volatile memory module, a memory control circuit unit, a signal modulation apparatus, and an observation circuit. The connection interface unit is configured to be coupled to a host system. The memory control circuit unit is coupled to the connection interface unit and the rewritable non-volatile memory module. The signal modulating apparatus is disposed in the connection interface unit. The observation circuit is disposed in the signal modulation apparatus. The signal modulation apparatus is configured to generate a second signal according to a first signal and a reference clock signal. A frequency of the first signal is different from a frequency of the second signal. The signal modulation apparatus is configured to obtain an observation information via the observation circuit. The observation information reflects a process variation of at least one electronic component in the signal modulation apparatus. The signal modulation apparatus is further configured to control an offset between the first signal and the reference clock signal according to the observation information.

An exemplary embodiment of the invention further provides a signal modulation method configured for a signal modulation apparatus. The signal modulation method includes: generating a second signal according to a first signal and a reference clock signal, wherein a frequency of the first signal is different from a frequency of the second signal; obtaining an observation information via an observation circuit, wherein the observation information reflects a process variation of at least one electronic component in the signal modulation apparatus; and controlling an offset between the first signal and the reference clock signal according to the observation information.

Based on the above, an exemplary embodiment of the invention provides that the observation information related to the process variation of at least one electronic component in the signal modulation apparatus may be obtained via the observation circuit in the signal modulation apparatus. Thereafter, the offset between the first signal and the reference clock signal may be controlled according to the observation information. Thereby, the operation stability of the signal modulation apparatus when generating the second signal according to the first signal and the reference clock signal may be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

A plurality of exemplary embodiments are presented below to illustrate the invention, but the invention is not limited to the plurality of exemplary embodiments illustrated. Also, appropriate combinations are allowed between the exemplary embodiments. The term "coupled to" used in the entire text of the specification of the present application (including claims) may refer to any direct or indirect connecting means. For instance, if the text describes a first apparatus is coupled to a second apparatus, then it should be understood that the first apparatus may be directly connected to the second apparatus, or the first apparatus may be indirectly connected to the second apparatus via other apparatuses or certain connecting means. In addition, the term "signal" may refer to at least one current, voltage, charge, temperature, data, or any other one or a plurality of signals.

Figure 1:
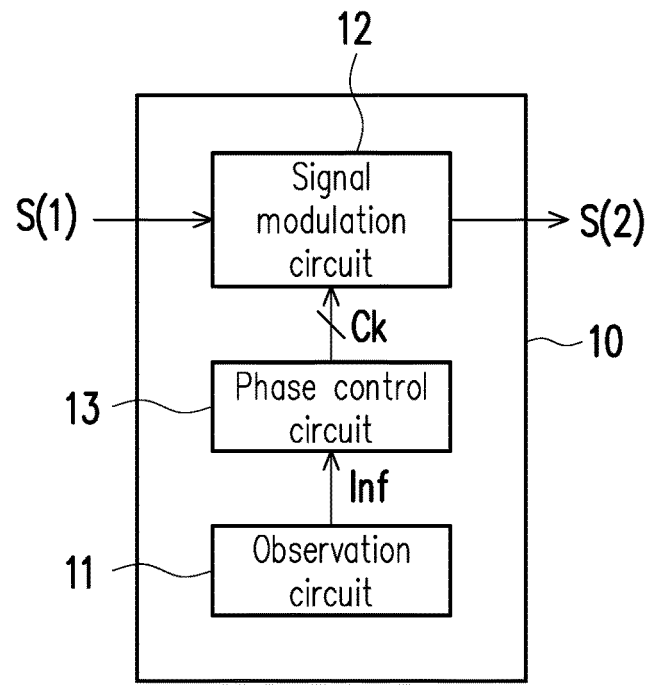
FIG. 1 is a schematic diagram of a signal modulation apparatus shown according to an embodiment of the invention.

FIG. 1 is a schematic diagram of a signal modulation apparatus shown according to an embodiment of the invention. Referring to FIG. 1, a signal modulation apparatus 10 may be configured to receive a signal (also called a first signal) S(1) and modulate the signal S(1) to output a signal (also called a second signal) S(2). For example, the signal modulation apparatus 10 may be disposed in various electronic apparatuses with a signal transmission function, and the signal modulation apparatus 10 may be configured to change the transmission frequency or the transmission rate of the signal to be output. For example, the signal S(1) may be configured to represent a signal (such as a data signal) to be transmitted inside the electronic apparatus, and the signal modulation apparatus 10 may modulate the signal S(1) into the signal S(2) meeting a specific transmission frequency or transmission rate. The frequency of the signal S(2) may be higher than the frequency of the signal S(1). For example, the frequencies of the signals S(1) and S(2) may be 8 GHz and 16 GHz, 8 GHz and 32 GHz, or 16 GHz and 32 GHz, etc., and are not limited thereto. Thereafter, the signal S(2) may be transmitted to an external transmission medium or other electronic apparatuses.

In an exemplary embodiment, the signal modulation apparatus 10 may be disposed at the signal sending terminal of a specific electronic apparatus to convert the low-frequency signal S(1) inside the electronic apparatus into the high-frequency signal S(2). For example, in the case that the signal sending terminal of a specific electronic apparatus includes a serialization circuit (or called a serializer), the signal modulation apparatus 10 may be disposed in the serialization circuit to generate the high-frequency signal S(2) according to the low-frequency signal S(1). For example, the serialization circuit is configured to perform a parallel-to-serial operation on the signal S(1) to generate the signal S(2). In an exemplary embodiment, the serialization circuit is also referred to as a parallel-to-serial (P2S) circuit. Thereafter, the high-frequency signal S(2) may be output via the signal sending terminal of the electronic apparatus.

The signal modulation apparatus 10 includes an observation circuit 11, a signal modulation circuit 12, and a phase control circuit 13. The observation circuit 11 may be configured to provide an information (also referred to as observation information) Inf. In particular, the information Inf may reflect the process variation of at least one electronic component in the signal modulation apparatus 10. For example, the process variation may generally refer to a defect generated during the manufacturing process of at least one electronic component in the signal modulation apparatus 10. This process variation may affect the preset function of any electronic component in the signal modulation apparatus 10, causing the operation result thereof to deviate from the preset value or the ideal value.

In an exemplary embodiment, at least one electronic component in the signal modulation apparatus 10 that may have a process variation may be located in the observation circuit 11. In an exemplary embodiment, the phase control circuit 13 may detect the electrical characteristics of at least one electronic component in the observation circuit 11 to obtain the observation information Inf. In an exemplary embodiment, at least one electronic component in the signal modulation apparatus 10 that may have a process variation does not have to be located in the observation circuit 11.

In an exemplary embodiment, at least one electronic component in the signal modulation apparatus 10 that may have a process variation may include at least one of an oscillator and a transistor. For example, the oscillator may include a ring oscillator (ROSC) in the signal modulation apparatus 10 or other types of oscillators. For example, the transistor may include a field-effect transistor (FET) or other types of transistors.

The signal modulation circuit 12 may receive the signal S(1) and a signal (also referred to as reference clock signal) Ck. The signal modulation circuit 12 may be configured to generate the signal S(2) according to the signal S(1) and the signal Ck. The frequency of the signal S(1) is different from the frequency of the signal S(2). For example, in this case, the frequency of the signal S(1) is k GHz, and the frequency of the signal S(2) may be approximately (2×p)×k GHz, wherein p is a positive integer.

The phase control circuit 13 is coupled to the observation circuit 11 and the signal modulation circuit 12. The phase control circuit 13 may obtain the information Inf via the observation circuit 11 and provide the signal Ck to the signal modulation circuit 12. In particular, the phase control circuit 13 may be configured to control the offset between the signal S(1) and the signal Ck according to the information Inf. For example, the offset may refer to the phase difference or the frequency difference between the signal S(1) and the signal Ck.

In an exemplary embodiment, the phase control circuit 13 controls the offset between the signal S(1) and the signal Ck according to the information Inf to reduce or eliminate the adverse effects on the output of the signal S(2) due to the process variation of at least one electronic component in the signal modulation apparatus 10. In this way, the signal quality of the signal S(2) may be effectively improved or maintained and/or the operation stability of the signal modulation apparatus 10 may be improved.

Figure 2:
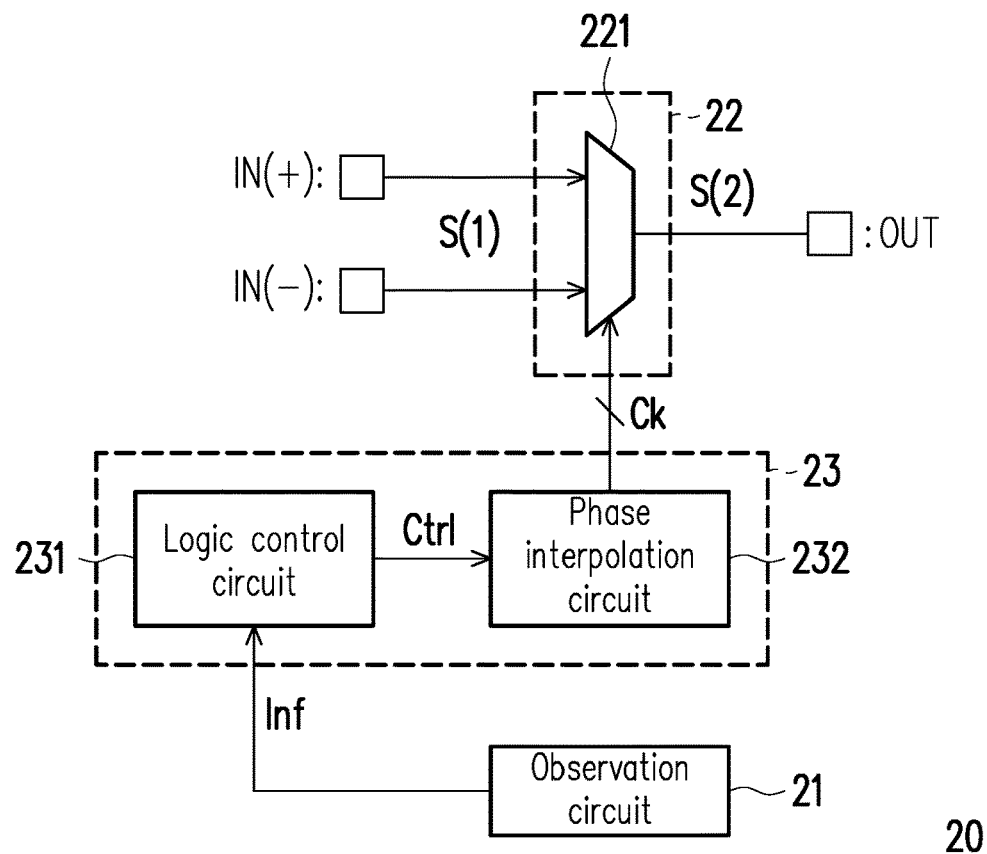
FIG. 2 is a schematic diagram of a signal modulation apparatus shown according to an exemplary embodiment of the invention.

FIG. 2 is a schematic diagram of a signal modulation apparatus shown according to an exemplary embodiment of the invention. Please refer to FIG. 2, a signal modulation apparatus 20 may be the same or similar to the signal modulation apparatus 10 of FIG. 1. The signal modulation apparatus 20 may include an observation circuit 21, a signal modulation circuit 22, and a phase control circuit 23. The observation circuit 21 may be the same or similar to the observation circuit 11 of FIG. 1.

The signal modulation circuit 22 may include a sampling circuit 221. Input terminals IN(+) and IN(−) of the sampling circuit 221 are configured to synchronously receive different signal components of the signal S(1). The sampling circuit 221 may sample the signal S(1) according to the signal Ck and output the signal S(2) according to the sampling result. An output terminal OUT of the sampling circuit 221 is configured to output the signal S(2). For example, the frequency of the signal S(2) may be approximately twice the frequency of the signal S(1). For example, if the frequency of the signal S(1) is 8 GHz, then the frequency of the signal S(2) may be about 16 GHz, and so on.

The phase control circuit 23 may include a logic control circuit 231 and a phase interpolation circuit 232. The logic control circuit 231 is coupled to the observation circuit 21. The phase interpolation circuit 232 is coupled to the logic control circuit 231 and the signal modulation circuit 22. The logic control circuit 231 may obtain the information Inf via the observation circuit 21. The logic control circuit 231 may provide a signal (also referred to as control signal) Ctrl to the phase interpolation circuit 232 according to the information Inf. The logic control circuit 231 may control or instruct the phase interpolation circuit 232 to adjust the sampling point of the signal Ck relative to the signal S(1) via the signal Ctrl. The phase interpolation circuit 232 may be configured to output the signal Ck. In addition, the phase interpolation circuit 232 may adjust the sampling point of the signal Ck relative to the signal S(1) according to the signal Ctrl.

Figure 3:
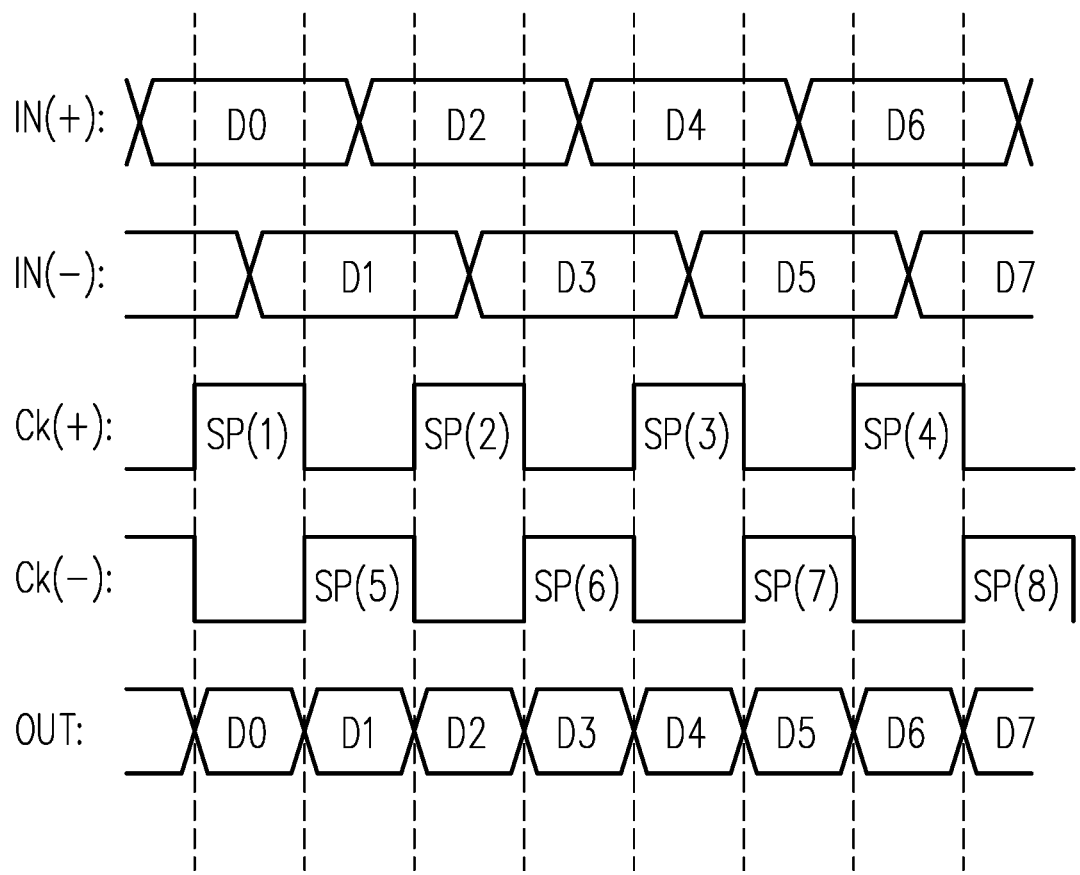
FIG. 3 is a schematic diagram of signal timing shown according to an exemplary embodiment of the invention.

FIG. 3 is a schematic diagram of signal timing shown according to an exemplary embodiment of the invention. Referring to FIG. 2 and FIG. 3, the input terminal IN(+) of the sampling circuit 221 may receive signal strings D0, D2, D4, and D6. The input terminal IN(−) of the sampling circuit 221 may receive signal strings D1, D3, D5, and D7. The phase difference between the two data signal strings received by the input terminals INN and IN(−) of the sampling circuit 221 is approximately 90 degrees. The sampling circuit 221 may respectively sample the signals of the input terminals IN(+) and IN(−) using signals Ck(+) and Ck(−) entrained in the signal Ck. The sampling circuit 221 may output the signal strings D0 to D7 at the output terminal OUT according to the sampling result.

In general, the closer sampling points SP(1) to SP(4) where the signal Ck(+) respectively samples the signals D0, D2, D4, and D6 on the input terminal IN(+) are to the center position of the signals D0, D2, D4, and D6, the more accurate the sampling result is, thus resulting in better signal quality of the signals D0, D2, D4, and D6 output by the output terminal OUT in principle. Similarly, the closer sampling points SP(5) to SP(8) where the signal Ck(−) respectively samples the signals D1, D3, D5, and D7 on the input terminal IN(−) are to the center position of the signals D1, D3, D5, and D7, the more accurate the sampling result is, thus resulting in better signal quality of the signals D1, D3, D5, and D7 output by the output terminal OUT in principle. However, in certain cases, for example, when there is a process variation in at least one electronic component in the signal modulation apparatus 20, the sampling points SP(1) to SP(8) are prone to offset, so that the signal quality of the signals D1 to D7 output by the output terminal OUT is deteriorated.

In an exemplary embodiment, the logic control circuit 231 may control the phase interpolation circuit 232 according to the information Inf to maintain the sampling points (e.g., the sampling points SP(1) to SP(8)) of the signal Ck relative to the signal S(1) at a better sampling position as much as possible (for example, align the respective centers of the signals D1 to D7 on the input terminals IN(+) and IN(−)). Accordingly, even if there is a process variation in at least one electronic component in the signal modulation apparatus 20, the adverse effects on the output of the signal S(2) due to the process variation may still be reduced or eliminated according to the information Inf.

In an exemplary embodiment, the logic control circuit 231 may determine the adjustment direction (for example, to advance or delay) and/or the adjustment range (for example, how many degrees) of the phase of the signal Ck according to the information Inf. The adjustment direction and/or the adjustment range may be configured to compensate for the possible adverse effects on the output of the signal S(2) due to the process variation of at least one electronic component in the signal modulation apparatus 20. The logic control circuit 231 may generate the signal Ctrl according to the adjustment direction and/or the adjustment range.

It should be noted that in the exemplary embodiments of FIG. 2 and FIG. 3, a one-stage sampling circuit is used as an example of the signal modulation circuit, but the invention is not limited thereto. In an exemplary embodiment, the signal modulation circuit may further include a multi-stage sampling circuit.

Figure 4:
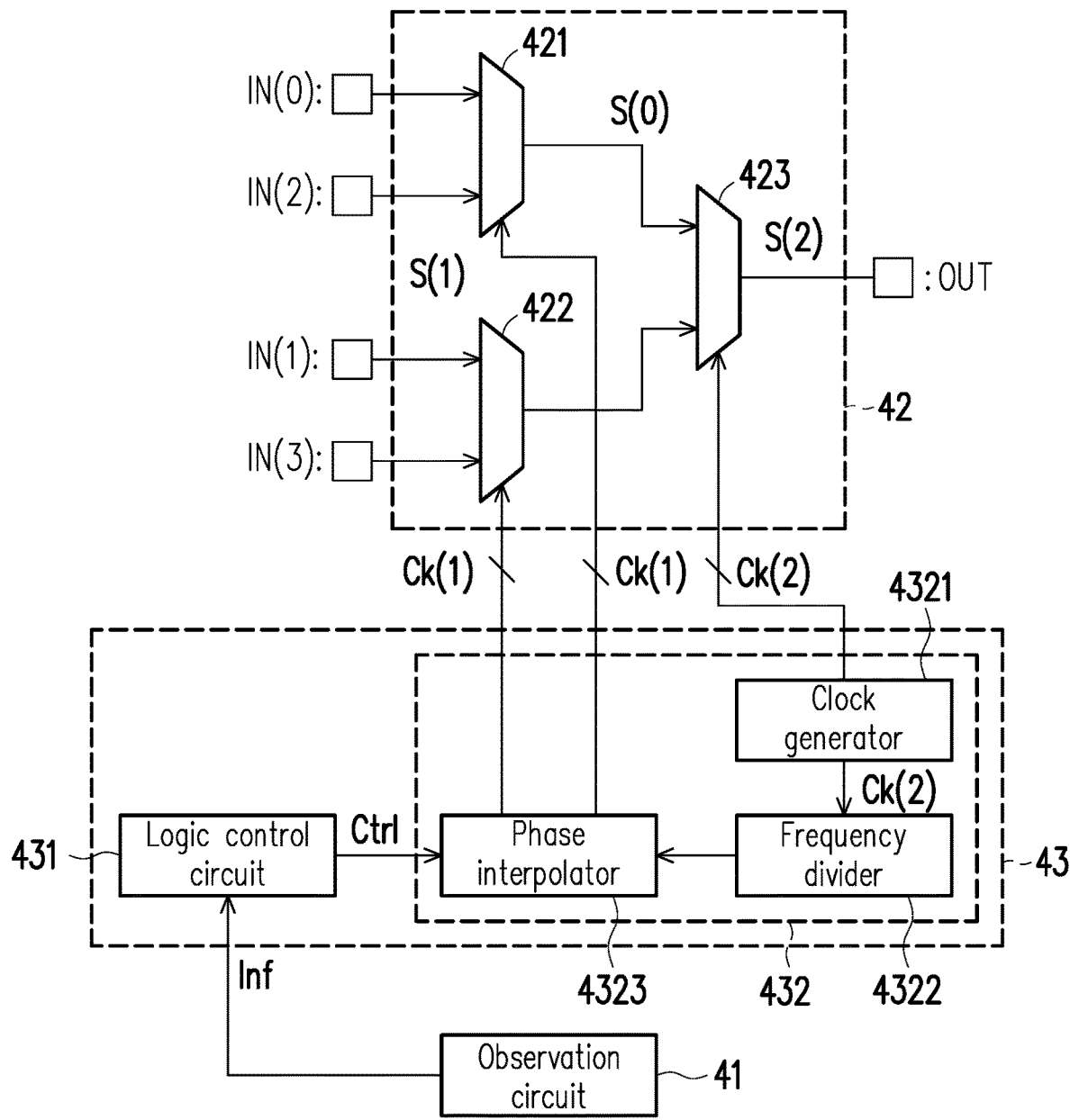
FIG. 4 is a schematic diagram of a signal modulation apparatus shown according to an exemplary embodiment of the invention.

FIG. 4 is a schematic diagram of a signal modulation apparatus shown according to an exemplary embodiment of the invention. Please refer to FIG. 4, a signal modulation apparatus 40 may be the same or similar to the signal modulation apparatus 10 of FIG. 1 (or the signal modulation apparatus 20 of FIG. 2). The signal modulation apparatus 40 may include an observation circuit 41, a signal modulation circuit 42, and a phase control circuit 43. The observation circuit 41 may be the same or similar to the observation circuit 11 of FIG. 1 (or the observation circuit 21 of FIG. 2).

The signal modulation circuit 42 may include sampling circuits 421 to 423. The sampling circuits 421 and 422 are also called first-stage sampling circuits. The sampling circuit 423 is also called a second-stage sampling circuit. Input terminals IN(0) to IN(3) of the sampling circuits 421 and 422 are configured to synchronously receive different signal components of the signal S(1). The sampling circuits 421 and 422 are coupled to the phase control circuit 43 and may receive a signal (also referred to as first reference clock signal) Ck(1) from the phase control circuit 43. The signal Ck(1) has a specific frequency (also called first frequency). The sampling circuits 421 and 422 may respectively sample the signal S(1) according to the signal Ck(1) and output a signal (also referred to as intermediate signal) S(0) according to the sampling result.

The sampling circuit 423 is coupled to the phase control circuit 43 and the output terminals of the sampling circuits 421 and 422. The sampling circuit 423 may receive a signal (also referred to as second reference clock signal) Ck(2) from the phase control circuit 43 and receive the signal S(0) from the output terminals of the sampling circuits 421 and 422. The signal Ck(2) has a specific frequency (also called second frequency). The frequency of the signal Ck(1) (i.e., first frequency) is different from the frequency of the signal Ck(2) (i.e., second frequency). For example, the frequency of the signal Ck(2) (i.e., second frequency) may be twice the frequency of the signal Ck(1) (i.e., first frequency). The sampling circuit 423 may sample the signal S(0) according to the signal Ck(2) and output the signal S(2) according to the sampling result. The output terminal OUT of the sampling circuit 423 may be configured to output the signal S(2). For example, the frequency of the signal S(2) may be approximately four times the frequency of the signal S(1).

For example, if the frequency of the signal S(1) is 8 GHz, then the frequency of the signal S(2) may be about 32 GHz, and so on.

The phase control circuit 43 may include a logic control circuit 431 and a phase interpolation circuit 432. The logic control circuit 431 is coupled to the observation circuit 41. The phase interpolation circuit 432 is coupled to the logic control circuit 431 and the signal modulation circuit 42. The logic control circuit 431 may obtain the information Inf via the observation circuit 41. The logic control circuit 431 may provide the signal Ctrl to the phase interpolation circuit 432 according to the information Inf. The logic control circuit 231 may control or instruct the phase interpolation circuit 432 to adjust the sampling point of the signal Ck(1) relative to the signal S(1) via the signal Ctrl.

The phase interpolation circuit 432 includes a clock generator 4321, a frequency divider 4322, and a phase interpolator 4323. The clock generator 4321 may be configured to generate the signal Ck(2). For example, the clock generator 4321 may include a ring oscillator or various oscillators that may be configured to generate an oscillation signal. The clock generator 4321 may provide the signal Ck(2) to the signal modulation circuit 42 (for example, the sampling circuit 423).

The frequency divider 4322 is coupled to the clock generator 4321 and the phase interpolator 4323. The frequency divider 4322 may be configured to divide the signal Ck(2). The phase interpolator 4323 may generate the signal Ck(1) according to the frequency division of the signal Ck(2) by the frequency divider 4322. For example, after the signal Ck(2) is frequency-divided, the frequency divider 4322 may send a control code indicating the phase level to the phase interpolator 4323. The phase interpolator 4323 may perform the phase difference according to the control code and output the signal Ck(1). In particular, the phase of the signal Ck(1) may be controlled by this control code.

It should be noted that in the exemplary embodiment of FIG. 4, after the frequency divider 4322 transmits the control code indicating the phase level to the phase interpolator 4323, the phase interpolator 4323 may update the control code according to the signal Ctrl. According to the updated control code, the phase of the signal Ck(1) output by the phase interpolator 4323 may be more accurately maintained at a better sampling position for the signal S(1). In this way, the adverse effects on the output of the signal S(2) due to the process variation of at least one electrical component in the signal modulation apparatus 40 may also be reduced or eliminated.

Figure 5:
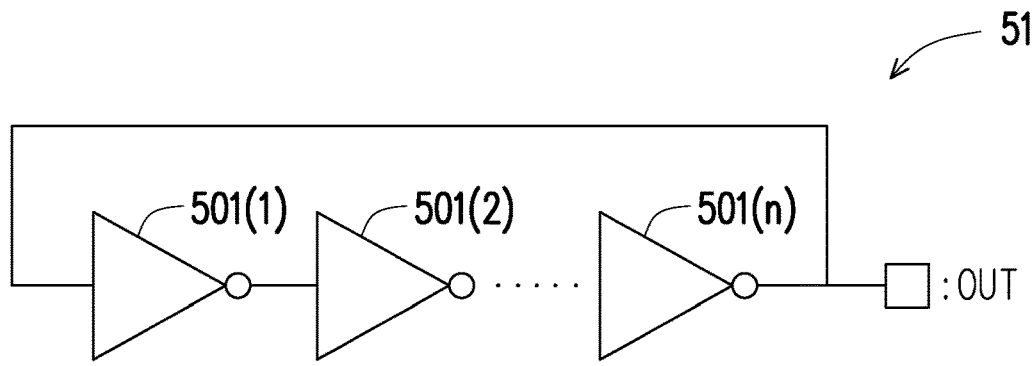
FIG. 5 is a schematic diagram of a circuit unit that may have a process variation shown according to an exemplary embodiment of the invention.

FIG. 5 is a schematic diagram of a circuit unit that may have a process variation shown according to an exemplary embodiment of the invention. Please refer to FIG. 5, an oscillator 51 includes a ring oscillator. The oscillator 51 may be included in a signal adjustment circuit 10, 20, or 40. A portion of electronic components in the oscillator 51 (for example, buffer components 501(1) to 501(n)) may cause an error in the frequency of the output oscillation signal due to a process variation. In an exemplary embodiment, the information Inf may include or reflect the frequency of the oscillation signal output by the oscillator 51 (i.e., oscillation frequency).

In an exemplary embodiment, the observation circuit 11, 21, or 41 may be configured to detect the frequency error of the oscillation signal output by the oscillator 51 and provide the information Inf according to the error. Taking the observation circuit 41 as an example, the observation circuit 41 may compare the frequency of the oscillation signal output by the oscillator 51 with a standard oscillation frequency and generate the information Inf according to the comparison result. In this way, the information Inf may reflect the difference between the frequency of the oscillation signal output by the oscillator 51 and one standard oscillation frequency. Both the information Inf and the difference may reflect the process variation of a portion of the electronic components in the oscillator 51 (for example, the buffer components 501(1) to 501(n)).

Figure 6:
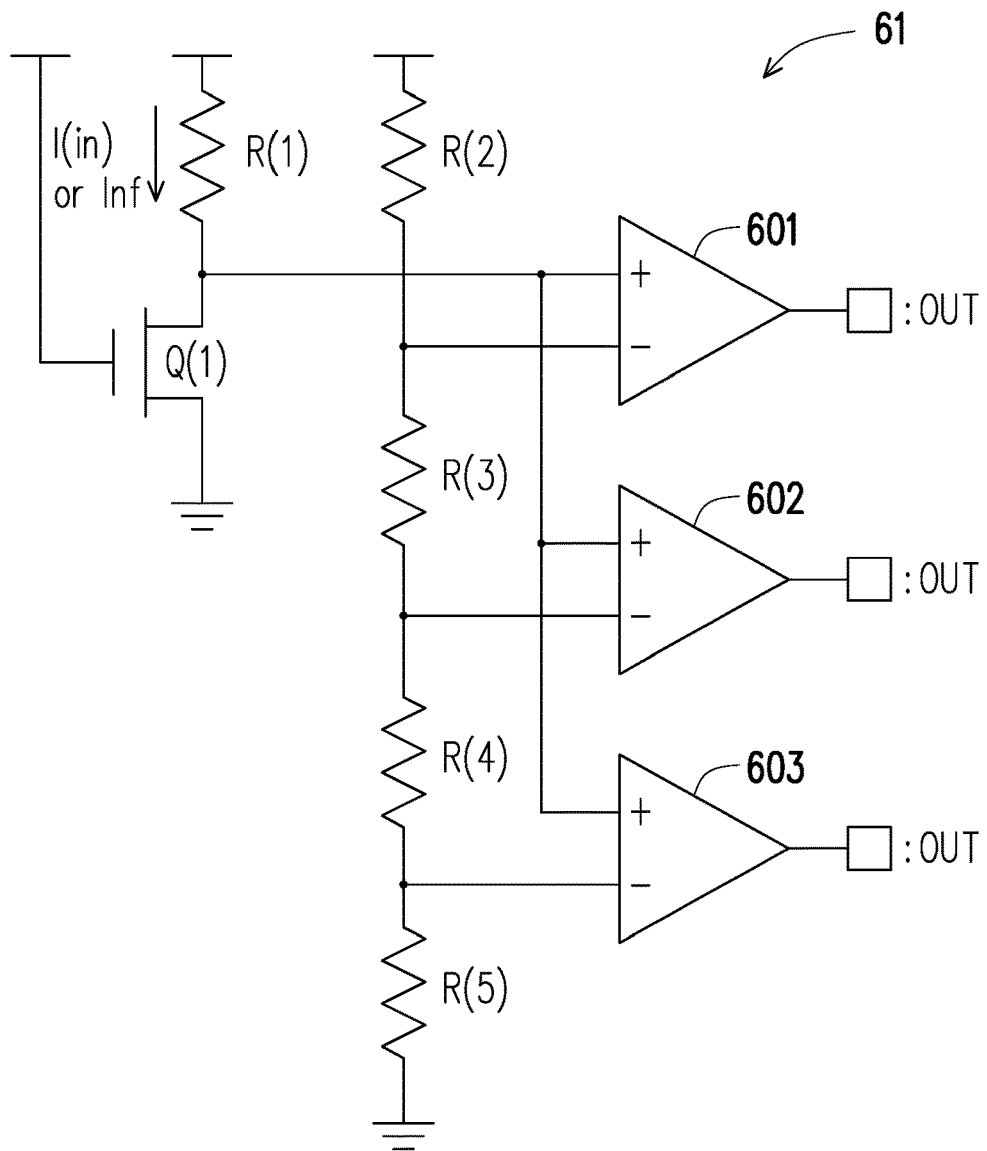
FIG. 6 is a schematic diagram of a circuit unit that may have a process variation shown according to an exemplary embodiment of the invention.

FIG. 6 is a schematic diagram of a circuit unit that may have a process variation shown according to an exemplary embodiment of the invention. Please refer to FIG. 6, a field-effect transistor Q(1) may be included in the observation circuit 61. The field-effect transistor Q(1) may cause a change to a current (also referred to as starting current) I(in) flowing through the field-effect transistor Q(1) due to a process variation. In an exemplary embodiment, an information Inf may include or reflect the current value of the startup current (i.e., the current I(in)) of the field-effect transistor Q(1).

In an exemplary embodiment, the observation circuit 61 may detect the current I(in) via impedance elements R(1) to R(5) and comparison elements 601 to 603. Then, the observation circuit 61 may compare the current value of the detected current I(in) with one standard current value and generate the information Inf according to the comparison result. In this way, the information Inf may reflect the difference between the current value of the current I(in) and the standard current value. Both the information Inf and this difference may reflect the process variation of the field-effect transistor Q(1).

In an exemplary embodiment, the information Inf includes a signal quality information of the signal S(2). The signal quality information of the signal S(2) may reflect the signal quality of the signal S(2). For example, the signal quality information of the signal S(2) includes related information such as the eye height of the signal S(2) and/or the eye width of the signal S(2) that may reflect the signal quality of the signal S(2). Taking FIG. 1 as an example, in an exemplary embodiment, the observation circuit 11 may analyze the signal S(2) and provide the information Inf that may reflect the signal quality of the signal S(2) to the phase control circuit 13.

In an exemplary embodiment of FIG. 1, the observation circuit 11 may be coupled to one internal loop-back (LPBK) path of the signal modulation apparatus 10. The phase control circuit 13 may analyze the signal S(2) on the internal LPBK path via the observation circuit 11 to obtain the information Inf. In an exemplary embodiment, the information Inf may include or reflect the data jitter amount of the signal S(2).

In an exemplary embodiment of FIG. 1, the observation circuit 11 may be coupled to one external loop-back (LPBK) path of the signal modulation apparatus 10. The phase control circuit 13 may analyze a signal S(2)' on the external LPBK path via the observation circuit 11 to obtain the information Inf. In an exemplary embodiment, the information Inf may include or reflect the data jitter amount of the signal S(2)'. It should be noted that, compared to the signal S(2), the signal S(2)' further carries external noise (such as channel noise) on the external LPBK path.

Figure 7:
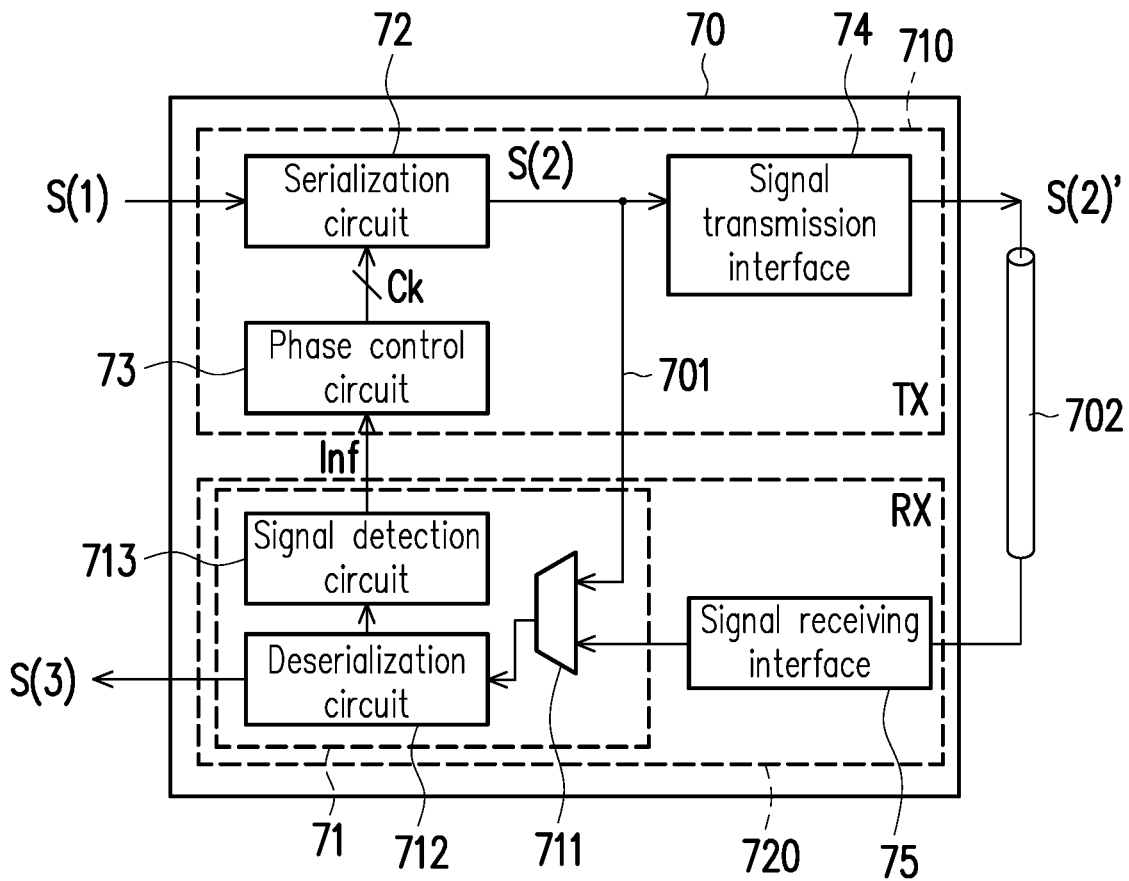
FIG. 7 is a schematic diagram of a signal modulation apparatus shown according to an exemplary embodiment of the invention.

FIG. 7 is a schematic diagram of a signal modulation apparatus shown according to an exemplary embodiment of the invention. Referring to FIG. 7, a signal modulation apparatus 70 includes a transmission terminal circuit 710 (marked as TX in FIG. 7) and a receiving terminal circuit 720 (marked as RX in FIG. 7). The transmission terminal circuit 710 is configured to transmit a signal to the outside of the signal modulation apparatus 70. The receiving terminal circuit 720 is configured to receive a signal from the outside of the signal modulation apparatus 70.

The transmission terminal circuit 710 includes a serialization circuit 72, a phase control circuit 73, and a signal transmission interface 74. The serialization circuit 72 is coupled to the phase control circuit 73 and the signal transmission interface 74. The serialization circuit 72 is configured to perform a P2S operation on the signal S(1) to generate the signal S(2). The serialization circuit 72 may include the signal modulation circuit 12, 22, or 42 in the above exemplary embodiment. The phase control circuit 73 may be the same or similar to the phase control circuit 13, 23, or 43 in the above exemplary embodiment. The signal transmission interface 74 may output the signal S(2)' to the outside of the signal modulation apparatus 70 according to the signal S(2) inside the signal modulation apparatus 70. For example, the signal transmission interface 74 may include at least one modulation circuit such as a signal amplifier. Thereby, the signal transmission interface 74 may modulate the signal S(2) into the signal S(2)' suitable for transmission outside the signal modulation apparatus 70.

The receiving terminal circuit 720 includes an observation circuit 71 and a signal receiving interface 75. The signal receiving interface 75 is coupled to the observation circuit 71. The signal receiving interface 75 may receive a signal from the outside of the signal modulation apparatus 70. For example, the signal receiving interface 75 may include at least a modulation circuit such as an equalizer. In this way, the signal receiving interface 75 may modulate the signal received from the outside into a signal suitable for analysis inside the signal modulating apparatus 70.

In an exemplary embodiment, the observation circuit 71 may be coupled to an internal LPBK path 701 of the signal modulation apparatus 70. The phase control circuit 73 may analyze the signal S(2) on the internal LPBK path 701 via the observation circuit 71 to obtain the information Inf. In particular, the information Inf obtained by analyzing the signal S(2) on the internal LPBK path 701 may reflect the signal quality of the signal S(2) that is not yet interfered by external noise. The phase control circuit 73 may control the offset between the signal S(1) and the signal Ck according to the information Inf (that is, the signal quality of the signal S(2) that is not yet interfered by external noise) to attempt to reduce or eliminate the adverse effects on the output of the signal S(2) due to the process variation of at least one electronic component in the signal modulation apparatus 70. The relevant operation details are detailed above, and are therefore not repeated herein.

In an exemplary embodiment, the observation circuit 71 may be coupled to an external LPBK path 702 of the signal modulation apparatus 70 via the signal receiving interface 75. The phase control circuit 73 may analyze the signal S(2)' on the external LPBK path 702 via the observation circuit 71 to obtain the information Inf. In particular, the information Inf obtained by analyzing the signal S(2)' on the external LPBK path 702 may reflect the signal quality of the signal S(2)' interfered by external noise. The phase control circuit 73 may control the offset between the signal S(1) and the signal Ck according to the information Inf (that is, the signal quality of the signal S(2)' interfered by external noise) to attempt to reduce or eliminate the adverse effects on the output of the signal S(2)' due to the process variation of at least one electronic component in the signal modulation apparatus 70. The relevant operation details are detailed above, and are therefore not repeated herein.

In an exemplary embodiment, the observation circuit 71 includes a multiplexer 711, a deserialization circuit 712, and a signal detection circuit 713. The multiplexer 711 is coupled to the deserialization circuit 712, the output terminal of the serialization circuit 72, and the signal receiving interface 75. The signal detection circuit 713 is coupled to the deserialization circuit 712 and the phase control circuit 73. The multiplexer 711 may turn on the internal LPBK path 701 or the external LPBK path 702. The deserialization circuit 712 is configured to perform a serial-to-parallel operation on the signal output by the multiplexer 711 to generate a signal S(3). In an exemplary embodiment, the deserialization circuit 712 is also referred to as a serial-to-parallel (S2P) circuit. For example, the frequency of the signal S(3) may be lower than the frequency of the signal S(2) or S(2)'. Alternatively, the frequency of the signal S(3) may be the same or close to the frequency of the signal S(1). The signal detection circuit 713 is configured to analyze the signal S(3) and generate the information Inf according to the analysis result. The information Inf may reflect the signal quality of the signal S(3). For example, the signal detection circuit 713 may include a detection circuit such as an eye width detector and/or an eye height detector that may be configured to evaluate the signal quality of the signal S(3).

In an exemplary embodiment, in this case, the internal LPBK path 701 is turned on, and the multiplexer 711 may transmit the signal S(2) on the internal LPBK path 701 to the deserialization circuit 712. The deserialization circuit 712 may perform a S2P operation on the signal S(2) and generate the signal S(3). Then, the signal detection circuit 713 may analyze the signal S(3) and provide the corresponding information Inf to the phase control circuit 73. It should be noted that in the present exemplary embodiment, the information Inf may reflect the signal quality of the signal S(2) that is not interfered by external noise.

In an exemplary embodiment, in this case, the external LPBK path 702 is turned on, and the multiplexer 711 may feed back the signal S(2)' on the external LPBK path 702 to the deserialization circuit 712. The deserialization circuit 712 may perform a S2P operation on the signal S(2)' and generate the signal S(3). Then, the signal detection circuit 713 may analyze the signal S(3) and provide the corresponding information Inf to the phase control circuit 73. It should be noted that in the present exemplary embodiment, the information Inf may reflect the signal quality of the signal S(2)' interfered by external noise.

It should be noted that the arrangement and the coupling of all circuit modules in the signal modulation circuit mentioned in the above exemplary embodiments are only examples, and are not intended to limit the invention. In other exemplary embodiments, the arrangement and the coupling methods of all circuit modules in the signal modulation circuit may both be adjusted according to practical requirements. Moreover, in other exemplary embodiments, more useful circuit modules and/or electronic elements may be added to the signal modulation circuit or configured to replace specific circuit modules and/or electronic elements in the signal modulation circuit, depending on practical requirements.

In an exemplary embodiment, the signal modulation apparatuses 10, 20, 40, and/or 70 mentioned in the above exemplary embodiments may be disposed in a memory storage apparatus. However, in another exemplary embodiment, the signal modulation apparatuses 10, 20, 40, and/or 70 may also be disposed in other types of electronic apparatuses, and are not limited to a memory storage apparatus.

In an exemplary embodiment, a memory storage apparatus (also referred to as a memory storage system) includes a rewritable non-volatile memory module and a controller (also referred to as a control circuit). The memory storage apparatus is generally used with a host system, such that the host system may write data into the memory storage apparatus or read data from the memory storage apparatus.

Figure 8:
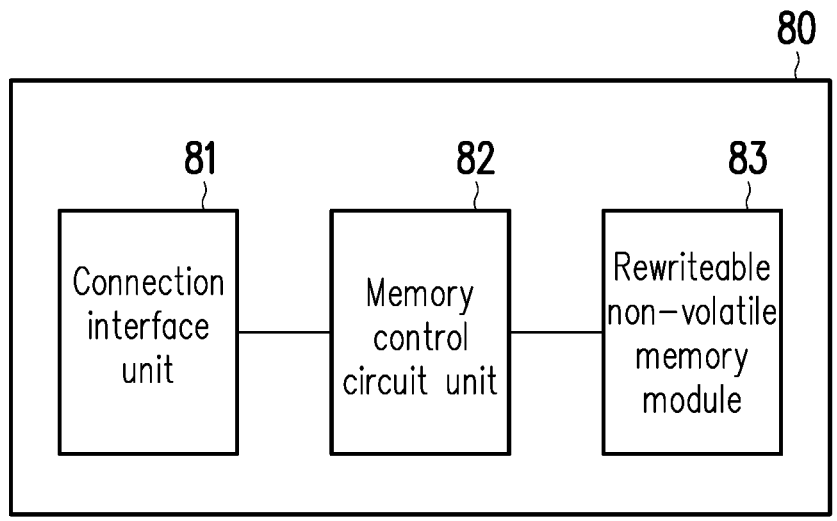
FIG. 8 is a schematic block diagram of a memory storage apparatus shown according to an exemplary embodiment of the invention.

FIG. 8 is a schematic block diagram of a memory storage apparatus shown according to an exemplary embodiment of the invention. Referring to FIG. 8, the memory storage apparatus 80 includes a connection interface unit 81, a memory control circuit unit 82, and a rewritable non-volatile memory module 83. The signal modulation apparatuses 10, 20, 40, and/or 70 mentioned in the above exemplary embodiments may be disposed in the connection interface unit 81, the memory control circuit unit 82, and/or the rewritable non-volatile memory module 83.

The connection interface unit 81 is configured to couple the memory storage apparatus 80 to a host system. The memory storage apparatus 80 may communicate with the host system via the connection interface unit 81. In an exemplary embodiment, the connection interface unit 81 is compatible with the serial advanced technology attachment (SATA) standard. However, it should be understood that the invention is not limited thereto, and the connection interface unit 81 may also comply with the Parallel Advanced Technology Attachment (PATA) standard, Institute of Electrical and Electronic Engineers (IEEE) 1394 standard, Peripheral Component Interconnect Express (PCI Express) standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 81 may be sealed in a chip with the memory control circuit unit 82. Alternatively, the connection interface unit 81 is disposed outside of a chip containing the memory control circuit unit 82.

The memory control circuit unit 82 is configured to execute a plurality of logic gates or control commands implemented in a hardware form or in a firmware form. The memory control circuit unit 82 also performs operations such as writing, reading, and erasing data in the rewritable non-volatile memory storage module 83 according to the commands of the host system.

The rewritable non-volatile memory module 83 is coupled to the memory control circuit unit 82 and configured to store data written by the host system. The rewritable non-volatile memory module 83 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 83 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 83 has a plurality of storage statuses. Which storage status one memory cell belongs to may be determined via the application of a read voltage, so as to obtain one or a plurality of bits stored by the memory cell.

In the present exemplary embodiment, the memory cells of the rewritable non-volatile memory module 83 form a plurality of physical programming units, and these physical programming units form a plurality of physical erasing units. Specifically, the memory cells on the same word line form one or a plurality of physical programming units. If each memory cell may store two or more bits, then the physical programming units on the same word line may at least be classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In the present exemplary embodiment, the physical programming unit is the smallest unit of programming. That is, the physical programming unit is the smallest unit of data writing. For instance, the physical programming unit is a physical page or a physical sector. If the physical programming unit is a physical page, then the physical programming unit generally includes a data bit area and a redundant bit area. The data bit area contains a plurality of physical pages configured to store user data, and the redundant bit area is configured to store system data (for example, management data such as an ECC). In the present exemplary embodiment, the data bit area contains 32 physical pages, and the size of one physical sector is 512 bytes (B). However, in other exemplary embodiments, the data bit area may also contain 8, 16, or a greater or lesser number of physical pages, and the size of each of the physical pages may also be greater or smaller. Moreover, the physical erasing unit is the smallest unit of erasing. That is, each of the physical erasing units contains the smallest number of memory cells erased together. For example, the physical erasing unit is a physical block.

Figure 9:
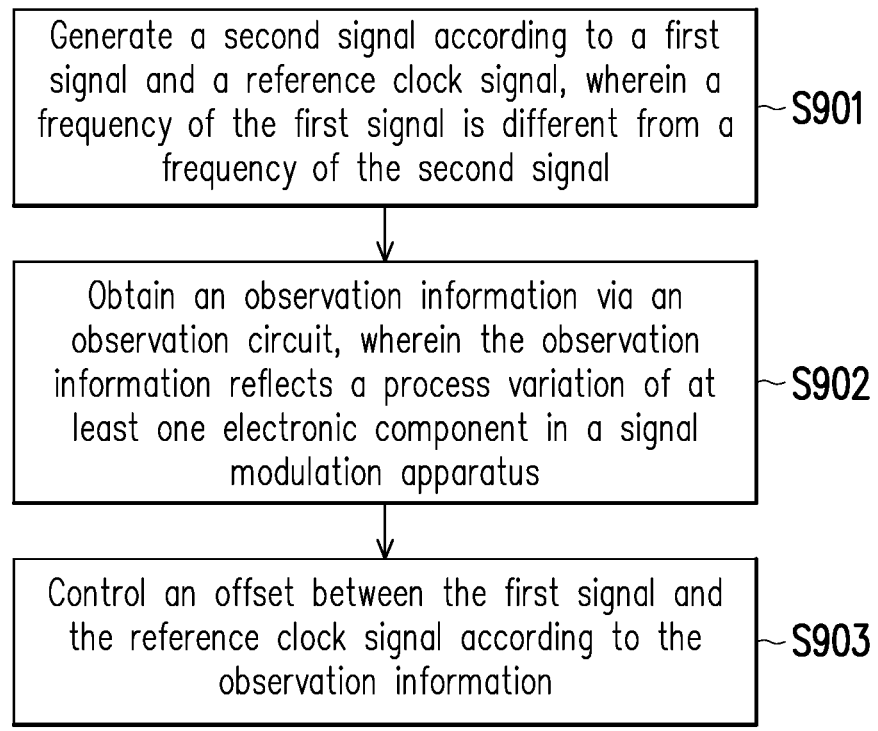
FIG. 9 is a flowchart of a signal modulation method shown according to an exemplary embodiment of the invention.

FIG. 9 is a flowchart of a signal modulation method shown according to an exemplary embodiment of the invention. Referring to FIG. 9, in step S901, a second signal is generated according to a first signal and a reference clock signal, wherein a frequency of the first signal is different from a frequency of the second signal. In step S902, an observation information is obtained via an observation circuit, wherein the observation information reflects a process variation of at least one electronic component in the signal modulation apparatus. In step S903, an offset between the first signal and the reference clock signal is controlled according to the observation information.

It should be noted that, each step in FIG. 9 is described in detail above, and is therefore not repeated herein. Each step in FIG. 9 may be implemented as a plurality of program codes or circuits, and the invention is not limited thereto. Moreover, the method of FIG. 9 may be used with the above exemplary embodiments, and may also be used alone, and the invention is not limited thereto.

Based on the above, an exemplary embodiment of the invention provides that the observation information related to the process variation of at least one electronic component in the signal modulation apparatus may be obtained via the observation circuit in the signal modulation apparatus. Thereafter, the offset between the first signal and the reference clock signal may be controlled according to the observation information, thereby improving the operational stability of the signal modulation apparatus when generating the second signal according to the first signal and the reference clock signal.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:
1. A signal modulation apparatus, comprising:
an observation circuit;
a signal modulation circuit configured to generate a second signal according to a first signal and a reference clock signal, wherein a frequency of the first signal is different from a frequency of the second signal; and
a phase control circuit coupled to the signal modulation circuit and the observation circuit,
wherein the phase control circuit is configured to obtain an observation information via the observation circuit, and the observation information reflects a process variation of at least one electronic component in the signal modulation apparatus, and
the phase control circuit is further configured to control an offset between the first signal and the reference clock signal according to the observation information.
2. The signal modulation apparatus of claim 1, wherein the phase control circuit comprises:
a logic control circuit coupled to the observation circuit; and
a phase interpolation circuit coupled to the signal modulation circuit and the logic control circuit,
wherein the logic control circuit is configured to control the phase interpolation circuit to adjust a sampling point of the reference clock signal relative to the first signal according to the observation information.
3. The signal modulation apparatus of claim 1, wherein the operation of obtaining the observation information via the observation circuit comprises:
detecting an electrical characteristic of the at least one electronic component to obtain the observation information.
4. The signal modulation apparatus of claim 1, wherein the at least one electronic component comprises at least one of an oscillator and a transistor.
5. The signal modulation apparatus of claim 1, wherein the observation information comprises a signal quality information of the second signal, the observation circuit is coupled to an internal loop-back path of the signal modulation apparatus, and the operation of obtaining the observation information via the observation circuit comprises:
analyzing the second signal on the internal loop-back path via the observation circuit to obtain the observation information.
6. The signal modulation apparatus of claim 1, wherein the observation information comprises a signal quality information of the second signal, the observation circuit is coupled to an external loop-back path of the signal modulation apparatus, and the operation of obtaining the observation information via the observation circuit comprises:
analyzing the second signal on the external loop-back path via the observation circuit to obtain the observation information.
7. The signal modulation apparatus of claim 1, wherein the signal modulation circuit comprises:
a sampling circuit coupled to the phase control circuit,
wherein the sampling circuit is configured to sample the first signal according to the reference clock signal to generate the second signal.
8. The signal modulation apparatus of claim 7, wherein the reference clock signal comprises a first reference clock signal and a second reference clock signal, the first reference clock signal has a first frequency, the second reference clock signal has a second frequency, the first frequency is different from the second frequency, and the sampling circuit comprises:
a first-stage sampling circuit coupled to the phase control circuit; and
a second-stage sampling circuit coupled to the phase control circuit and an output terminal of the first-stage sampling circuit,
wherein the first-stage sampling circuit is configured to sample the first signal according to the first reference clock signal and output an intermediate signal, and
the second-stage sampling circuit is configured to sample the intermediate signal according to the second reference clock signal and output the second signal.
9. The signal modulation apparatus of claim 8, wherein the phase control circuit comprises:
a frequency divider coupled to the signal modulation circuit and configured to divide the second reference clock signal to generate the first reference clock signal.
10. The signal modulation apparatus of claim 1, wherein the frequency of the second signal is higher than the frequency of the first signal.
11. The signal modulation apparatus of claim 1, wherein the signal modulation apparatus is disposed at a signal sending terminal of an electronic apparatus and located in a serialization circuit, and the signal sending terminal is configured to output the second signal.
12. The signal modulation apparatus of claim 1, wherein the observation information comprises at least one of a data jitter amount of a data signal, an oscillation frequency of an oscillation signal, and a starting current of a transistor.
13. The signal modulation apparatus of claim 1, further comprising:
a signal transmission interface coupled to the signal modulation circuit; and
a signal receiving interface coupled to the observation circuit,
wherein the signal transmission interface is configured to transmit the second signal to an outside of the signal modulation apparatus, and
the signal receiving interface is configured to receive a signal from the outside of the signal modulation apparatus.
14. The signal modulation apparatus of claim 13, wherein the observation circuit comprises:

a multiplexer coupled to the signal modulation circuit and the signal receiving interface;

a deserialization circuit coupled to the multiplexer; and a signal detection circuit coupled to the deserialization circuit and the phase control circuit, wherein the multiplexer is configured to transmit the second signal on an internal loop-back path or an external loop-back path of the signal modulation apparatus to the deserialization circuit, the deserialization circuit is configured to perform a serial-to-parallel operation on the second signal to generate a third signal, and the signal detection circuit is configured to generate a signal quality information corresponding to the third signal, wherein the observation information comprises the signal quality information of the third signal.

15. A memory storage apparatus, comprising:

a connection interface unit configured to be coupled to a host system;

a rewritable non-volatile memory module;

a memory control circuit unit coupled to the connection interface unit and the rewritable non-volatile memory module;

a signal modulating apparatus disposed in the connection interface unit; and an observation circuit disposed in the signal modulation apparatus, wherein the signal modulation apparatus is configured to generate a second signal according to a first signal and a reference clock signal, and a frequency of the first signal is different from a frequency of the second signal, the signal modulation apparatus is further configured to obtain an observation information via the observation circuit, and the observation information reflects a process variation of at least one electronic component in the signal modulation apparatus, and the signal modulation apparatus is further configured to control an offset between the first signal and the reference clock signal according to the observation information.

16. The memory storage apparatus of claim 15, wherein the operation of controlling the offset between the first signal and the reference clock signal according to the observation information comprises:

adjusting a sampling point of the reference clock signal relative to the first signal according to the observation information.

17. The memory storage apparatus of claim 15, wherein the operation of obtaining the observation information via the observation circuit comprises:

detecting an electrical characteristic of the at least one electronic component to obtain the observation information.

18. The memory storage apparatus of claim 15, wherein the at least one electronic component comprises at least one of an oscillator and a transistor.

19. The memory storage apparatus of claim 15, wherein the observation information comprises a signal quality information of the second signal, the observation circuit is coupled to an internal loop-back path of the signal modulation apparatus, and the operation of obtaining the observation information via the observation circuit comprises:

analyzing the second signal on the internal loop-back path via the observation circuit to obtain the observation information.

20. The memory storage apparatus of claim 15, wherein the observation information comprises a signal quality information of the second signal, the observation circuit is coupled to an external loop-back path of the signal modulation apparatus, and the operation of obtaining the observation information via the observation circuit comprises:

analyzing the second signal on the external loop-back path via the observation circuit to obtain the observation information.

21. The memory storage apparatus of claim 15, wherein the operation of generating the second signal according to the first signal and the reference clock signal comprises:

sampling the first signal according to the reference clock signal to generate the second signal.

22. The memory storage apparatus of claim 21, wherein the reference clock signal comprises a first reference clock signal and a second reference clock signal, the first reference clock signal has a first frequency, the second reference clock signal has a second frequency, the first frequency is different from the second frequency, and the operation of sampling the first signal according to the reference clock signal to generate the second signal comprises:

sampling the first signal according to the first reference clock signal and outputting an intermediate signal; and sampling the intermediate signal according to the second reference clock signal and outputting the second signal.

23. The memory storage apparatus of claim 22, wherein the signal modulation apparatus is further configured to divide the second reference clock signal to generate the first reference clock signal.

24. The memory storage apparatus of claim 15, wherein the frequency of the second signal is higher than the frequency of the first signal.

25. The memory storage apparatus of claim 15, wherein the signal modulation apparatus is disposed at a signal sending terminal of the connection interface unit and located in a serialization circuit, and the signal sending terminal is configured to output the second signal.

26. The memory storage apparatus of claim 15, wherein the observation information comprises at least one of a data jitter amount of a data signal, an oscillation frequency of an oscillation signal, and a starting current of a transistor.

27. The memory storage apparatus of claim 15, wherein the signal modulation apparatus comprises:

a signal transmission interface coupled to the signal modulation circuit; and a signal receiving interface coupled to the observation circuit, wherein the signal transmission interface is configured to transmit the second signal to an outside of the signal modulation apparatus, and the signal receiving interface is configured to receive a signal from the outside of the signal modulation apparatus.

28. The memory storage apparatus of claim 27, wherein the observation circuit comprises:

a multiplexer coupled to the signal receiving interface;

a deserialization circuit coupled to the multiplexer; and a signal detection circuit coupled to the deserialization circuit, wherein the multiplexer is configured to transmit the second signal on an internal loop-back path or an external loop-back path of the signal modulation apparatus to the deserialization circuit, the deserialization circuit is configured to perform a serial-to-parallel operation on the second signal to generate a third signal, and the signal detection circuit is configured to generate a signal quality information corresponding to the third signal, wherein the observation information comprises the signal quality information of the third signal.

29. A signal modulation method, configured for a signal modulation apparatus, and the signal modulation method comprises:
generating a second signal according to a first signal and a reference clock signal, wherein a frequency of the first signal is different from a frequency of the second signal;
obtaining an observation information via an observation circuit, wherein the observation information reflects a process variation of at least one electronic component in the signal modulation apparatus; and
controlling an offset between the first signal and the reference clock signal according to the observation information.

30. The signal modulation method of claim 29, wherein the step of controlling the offset between the first signal and the reference clock signal according to the observation information comprises:
adjusting a sampling point of the reference clock signal relative to the first signal according to the observation information.

31. The signal modulation method of claim 29, wherein the step of obtaining the observation information via the observation circuit comprises:
detecting an electrical characteristic of the at least one electronic component to obtain the observation information.

32. The signal modulation method of claim 29, wherein the at least one electronic component comprises at least one of an oscillator and a transistor.

33. The signal modulation method of claim 29, wherein the observation information comprises a signal quality information of the second signal, the observation circuit is coupled to an internal loop-back path of the signal modulation apparatus, and the step of obtaining the observation information via the observation circuit comprises:
analyzing the second signal on the internal loop-back path via the observation circuit to obtain the observation information.

34. The signal modulation method of claim 29, wherein the observation information comprises a signal quality information of the second signal, the observation circuit is coupled to an external loop-back path of the signal modulation apparatus, and the step of obtaining the observation information via the observation circuit comprises:
analyzing the second signal on the external loop-back path via the observation circuit to obtain the observation information.

35. The signal modulation method of claim 29, wherein the step of generating the second signal according to the first signal and the reference clock signal comprises:
sampling the first signal according to the reference clock signal to generate the second signal.

36. The signal modulation method of claim 35, wherein the reference clock signal comprises a first reference clock signal and a second reference clock signal, the first reference clock signal has a first frequency, the second reference clock signal has a second frequency, the first frequency is different from the second frequency, and the step of sampling the first signal according to the reference clock signal to generate the second signal comprises:
sampling the first signal according to the first reference clock signal and outputting an intermediate signal; and
sampling the intermediate signal according to the second reference clock signal and outputting the second signal.

37. The signal modulation method of claim 36, further comprising:
dividing the second reference clock signal to generate the first reference clock signal.

38. The signal modulation method of claim 29, wherein the frequency of the second signal is higher than the frequency of the first signal.

39. The signal modulation method of claim 29, wherein the signal modulation apparatus is disposed at a signal sending terminal of the signal modulation apparatus and located in a serialization circuit, and the signal sending terminal is configured to output the second signal.

40. The signal modulation method of claim 29, wherein the observation information comprises at least one of a data jitter amount of a data signal, an oscillation frequency of an oscillation signal, and a starting current of a transistor.

41. The signal modulation method of claim 29, further comprising:
transmitting the second signal to an outside of the signal modulation apparatus via a signal transmission interface; and
receiving a signal from the outside of the signal modulation apparatus via a signal receiving interface.

42. The signal modulation method of claim 41, wherein the step of obtaining the observation information via the observation circuit comprises:
transmitting the second signal on an internal loop-back path or an external loop-back path of the signal modulation apparatus to a deserialization circuit;
performing a serial-to-parallel operation on the second signal via the deserialization circuit to generate a third signal; and
generating a signal quality information corresponding to the third signal, wherein the observation information comprises the signal quality information of the third signal.

* * * * *